United States Patent
Lin et al.

(10) Patent No.: US 12,439,582 B2
(45) Date of Patent: Oct. 7, 2025

(54) DEEP TRENCH CAPACITOR AND METHOD FOR FORMING THE SAME

(71) Applicant: Taiwan Semiconductor Manufacturing Company, Ltd., Hsin-Chu (TW)

(72) Inventors: Ming-Hsun Lin, Hsinchu (TW); Jyun-Ying Lin, Yilan County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 407 days.

(21) Appl. No.: 18/173,489

(22) Filed: Feb. 23, 2023

(65) Prior Publication Data

US 2024/0147689 A1 May 2, 2024

Related U.S. Application Data

(60) Provisional application No. 63/381,412, filed on Oct. 28, 2022.

(51) Int. Cl.
| | |
|---|---|
| H10B 12/00 | (2023.01) |
| H10D 1/00 | (2025.01) |
| H10D 1/66 | (2025.01) |

(52) U.S. Cl.
CPC ......... *H10B 12/0387* (2023.02); *H10D 1/047* (2025.01); *H10D 1/665* (2025.01)

(58) Field of Classification Search
CPC ..... H10B 12/0387; H10D 1/047; H10D 1/665
See application file for complete search history.

(56) References Cited

U.S. PATENT DOCUMENTS

| | | | | |
|---|---|---|---|---|
| 5,701,022 A | * | 12/1997 | Kellner ................. | H10B 12/37 257/E21.651 |
| 6,720,606 B1 | * | 4/2004 | Nitayama ............ | H10B 12/373 257/E21.651 |
| 10,593,604 B1 | * | 3/2020 | Lam ........................ | H01L 22/12 |
| 10,978,438 B1 | * | 4/2021 | Lam ..................... | H01L 23/5226 |
| 11,270,975 B2 | * | 3/2022 | Jeng ..................... | H01L 23/5223 |
| 2005/0224852 A1 | * | 10/2005 | Cheng .................... | H10D 1/047 257/E21.396 |
| 2006/0006446 A1 | * | 1/2006 | Schwerin ............. | H10D 30/608 257/E21.429 |

(Continued)

FOREIGN PATENT DOCUMENTS

| | | | | | |
|---|---|---|---|---|---|
| CN | 109791931 A | * | 5/2019 | ........ | H01L 27/11565 |
| CN | 113725206 A | * | 11/2021 | ............... | H01G 2/06 |

(Continued)

*Primary Examiner* — Mohammed Shamsuzzaman

(74) *Attorney, Agent, or Firm* — HAYNES AND BOONE, LLP

(57) ABSTRACT

Integrated circuits (ICs) and methods are provided. An IC includes a charge-storing device. The charge-storing device includes a first charge-storing stack extending into a substrate, and a second charge-storing stack extending into the substrate and adjacent to the first charge-storing stack along a first direction. The first charge-storing stack and the second charge-storing stack extend lengthwise along a second direction perpendicular to the first direction, and the first charge-storing stack and the second charge-storing stack have an offset along the second direction, the offset being greater than zero.

20 Claims, 14 Drawing Sheets

(56) References Cited

U.S. PATENT DOCUMENTS

| | | | | |
|---|---|---|---|---|
| 2007/0224757 A1* | 9/2007 | Cheng | ................ | H10B 12/0385 |
| | | | | 257/E21.396 |
| 2009/0163008 A1* | 6/2009 | Purayath | ................ | H10B 41/35 |
| | | | | 257/E21.179 |
| 2011/0204524 A1* | 8/2011 | Hannon | ................ | H10D 86/01 |
| | | | | 438/455 |
| 2015/0206884 A1* | 7/2015 | Barth, Jr. | ........... | H10B 12/0385 |
| | | | | 438/243 |
| 2022/0328696 A1 | 10/2022 | Chia | | |
| 2022/0336659 A1 | 10/2022 | Lin | | |

FOREIGN PATENT DOCUMENTS

| | | | | | |
|---|---|---|---|---|---|
| DE | 102004043857 B3 | * | 3/2006 | ........... | G11C 11/404 |
| DE | 102006023730 A1 | * | 12/2006 | ....... | H01L 27/10876 |
| DE | 102007016290 A1 | * | 11/2008 | ......... | H01L 21/3086 |
| JP | 2004088100 A | * | 3/2004 | ....... | H01L 27/10864 |
| TW | 202046450 A | * | 12/2020 | .............. | H01G 4/40 |
| TW | 202224199 A | | 6/2022 | | |
| TW | 202230746 A | | 8/2022 | | |

* cited by examiner

DEEP TRENCH CAPACITOR AND METHOD FOR FORMING THE SAME

CROSS REFERENCE(S)

The instant application is a nonprovisional of and claim priority under 35 U.S.C. 119 to U.S. provisional application no. 63/381,412, filed on Oct. 28, 2022, which is hereby expressly incorporated by reference herein in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

In semiconductor devices, capacitors formed in deep trenches, e.g., deep trench capacitors (DTCs), are widely used in electronic products such as memories and logic circuits to add capacitance to various integrated circuits. For example, DTCs can be used as storage capacitor for dynamic random access memory (DRAM)-based cells. In another example, DTCs can be part of a filtering circuit, part of a regulator circuit, and/or part of a decoupling circuit. The DTCs are often formed by etching deep trenches into a substrate, and forming capacitor structures in/above the trenches. Dense structures can be formed by combining DTCs and other devices/structures in semiconductor devices.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1A:
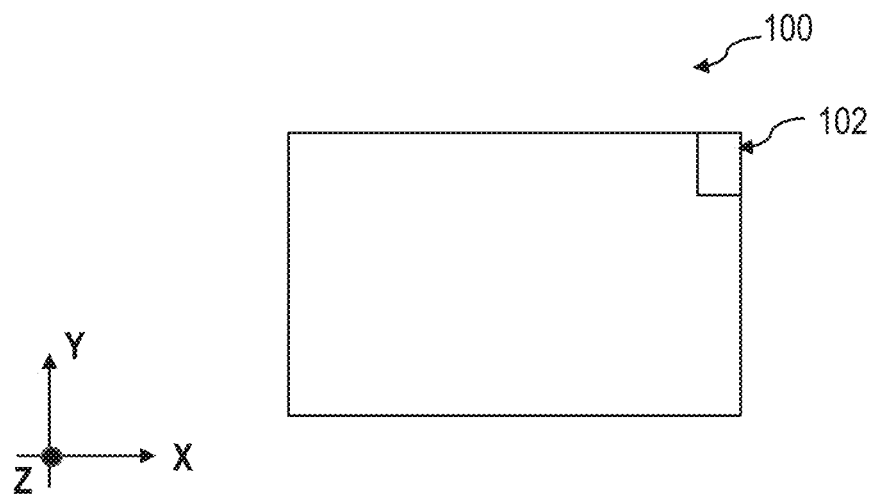
FIG. 1A illustrates a die in an integrated circuit (IC).

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

In some semiconductor devices, deep trench capacitors (DTCs) are formed in a substrate. DTCs are often formed in one or more trenches by forming charge-storing structures in/over the trench(es). A trench for forming a DTC often has a high length-to-width ratio and a high aspect (depth-to-width) ratio. These features can increase the capacitance density of the DTCs. For example, the length-to-width ratio of a trench is at least 15, and the aspect ratio of a trench is at least 20. However, the trenches of such high length-to-width ratio and aspect ratio can be susceptible to deformation and/or non-uniformity due to factors such as critical dimensions of structures and the fabrication process.

For example, a charge-storing structure often includes, over each trench, a plurality of conductive layers interleaved by a plurality of dielectric layers. To form a DTC, a plurality of trenches are first formed in the substrate. The forming of the trenches includes patterning the substrate using an etching process, e.g., dry etch. The uniformity of the etching process is at least partially dependent on the critical dimensions of the trenches (e.g., the widths of the trenches). For example, when the critical dimension of a trench is smaller, the etching of the trenches can be susceptible to non-uniformity, resulting in large trench depth variance. On the other hand, when the critical dimension of the trench is larger, the critical dimension of a substate portion of the substrate portion between adjacent trenches becomes smaller. In other words, the substrate portion between adjacent trenches may be thin, making it susceptible to deformation or collapse.

After the trenches are formed, materials for forming the charge-storing structure is deposited over the trenches, e.g., along the side surface and bottom surface of each trench. For example, a dielectric layer is first formed in direct contact with the sidewall and the bottom surface of a trench. The formation of the dielectric layer can introduce stress, e.g., tensile stress, over the sidewalls of the trenches, resulting in deformation of the trench (or the substrate portion between adjacent trenches).

Figure 1B:
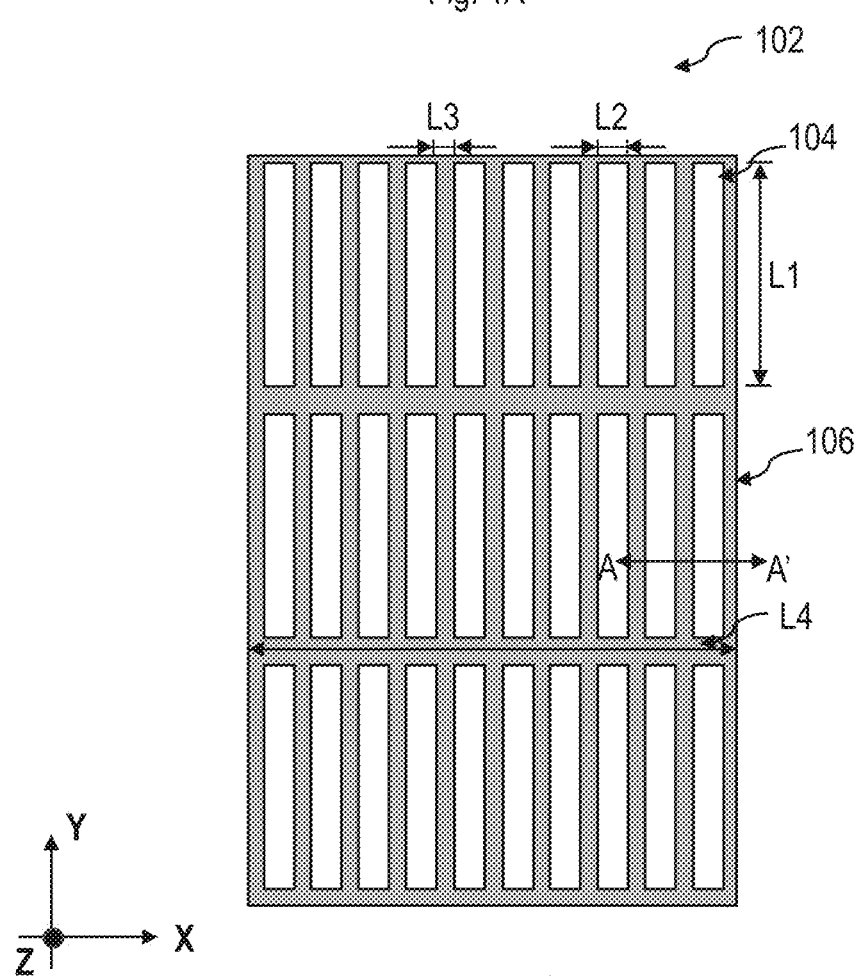
FIG. 1B illustrates a top view of a pattern of trenches for forming a deep trench capacitor (DTC) in the die.
Figure 1C:
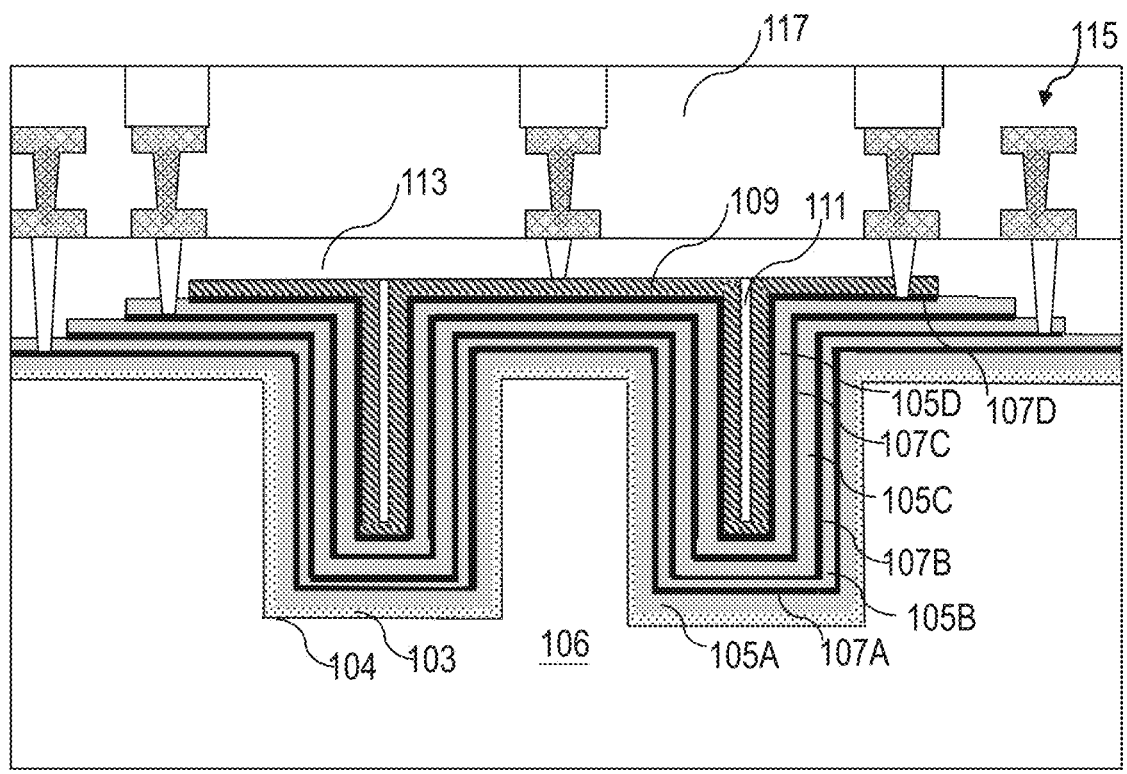
FIG. 1C illustrates a cross-sectional view part of the DTC in the die.
Figure 1C:
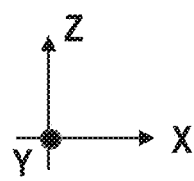

FIG. 1A illustrates an overview of a die 100 in a semiconductor chip. Die 100 may include an integrated circuit (IC), which may include at least one DTC. A DTC unit 102 represents part of DTC in die 100, and is shown as an example. FIG. 1B illustrates a pattern of trenches for forming the part of a DTC in DTC unit 102. FIG. 1C illustrates a cross-sectional view of a part of a DTC in a A-A' direction in FIG. 1B.

DTC unit 102 includes a plurality of trenches 104 in a substrate 106. Trenches 104 are arranged in an array of rows and columns. For example, a plurality of trenches 104 can be aligned in the x-direction and in the y-direction. Trenches 104 each has a length of L1 in the y-direction, a width L2 in the x-direction, and a depth d in the z-direction. Often, L1/L2 is at least 15, and d/L2 is at least 20. A charge-storing structure is formed in trenches 104 in die 100 to form the DTC.

FIG. 1C shows a cross-sectional view of the charge-storing structure in two adjacent trenches 104 in the A-A' direction. As shown in FIG. 1C, the DTC includes a charge-storing structure over (e.g., filling) trenches 104. Other structures of the DTC e.g., insulating layers and contact vias, are located above the charge-storing structure. The DTC includes a liner layer 103 over the sidewalls and bottom surfaces of trenches 104, a plurality of dielectric layers 105A, 105B, 105C, and 105D over liner layer 103, and a plurality of conductive layers 107A, 107B, 107C, and 107D over liner layer 103. Dielectric layers 105A-105D may be arranged interweavingly with conductive layers 107A-107D. The DTC also includes another dielectric layer 109 over the topmost conductive layer, e.g., 107D. The DTC further includes dielectric layers 113 and 117 over dielectric layer 109. Contact vias 115 are located in dielectric layers 113 and 117. Liner layer 103, dielectric layers 105A-105D, and dielectric layers 113 and 117 each includes one or more dielectric materials. Conductive layers 107A-107D, and contact vias 115 each includes one or more conductive materials. Electrical connection between contact vias 115 and other structures/devices are not shown.

Figure 1D:
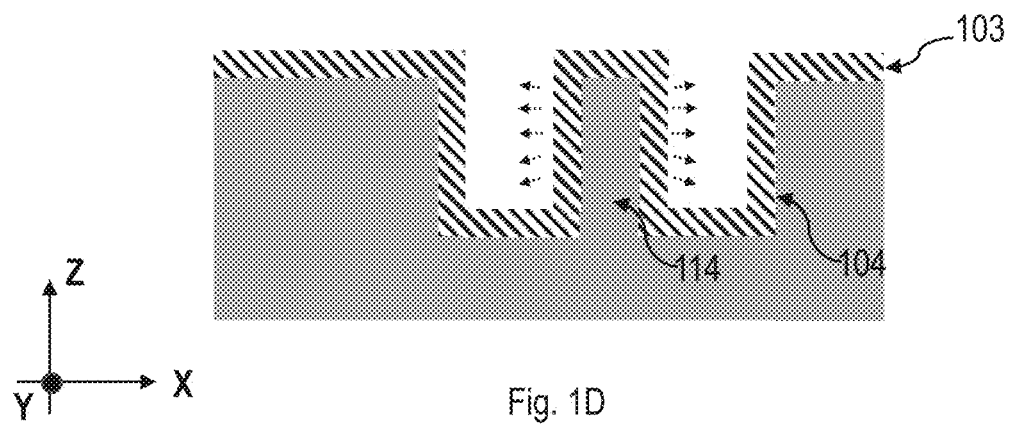
FIG. 1D illustrates a cross-sectional view of trenches for forming the DTC during a fabrication process.
Figure 1E:
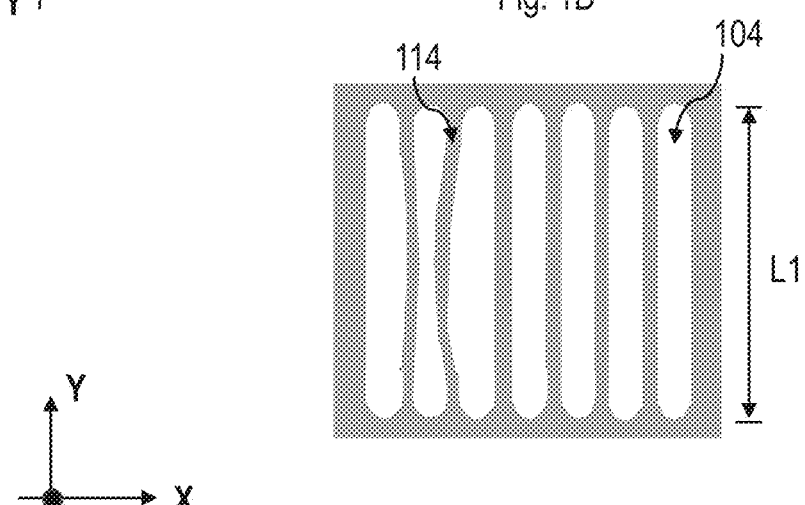
FIG. 1E illustrates a top view of trenches for forming the DTC during a fabrication process.
Figure 1F:
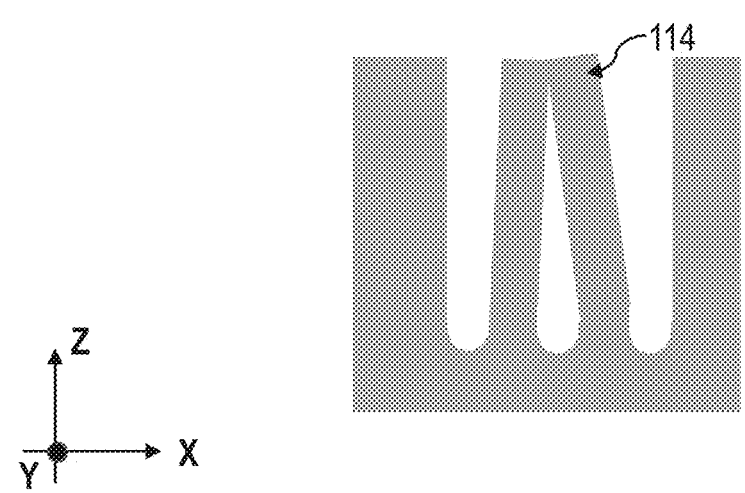
FIG. 1F illustrates another cross-sectional view of trenches for forming the DTC during a fabrication process.

To form the DTC, trenches 104 are first formed in a fabrication process, and other layers, e.g., liner layer 103, dielectric layers 105A-105D and conductive layers 107A-107D, are later deposited in trenches 104. As shown in FIG. 1D, as the critical dimension (e.g., in the x-direction) of trench 104 increases, the critical dimension of a substrate portion 114 (i.e., the unetched portion of substrate 106) between adjacent trenches 104 becomes smaller. Because adjacent trenches 104 are aligned (e.g., completely overlapped) with each other in the x-direction, as shown in FIG. 1B, substrate portion 114 can have a length of at least L1 in the y-direction. L1 can be much longer than the width (e.g., in the x-direction) of substrate portion 114. Substrate portion 114 can thus be susceptible to deformation (e.g., bending) and/or collapse during the patterning process due to factors such as lack of support in the x-direction. During the formation of the charge-storing structure, when a dielectric material (e.g., liner layer 103) is formed over the sidewalls of trenches 104, the dielectric material may exert stress, e.g., tensile stress, on the sidewalls of trenches 104. The stress may cause substrate portions 114 to deform and/or collapse. FIGS. 1E and 1F respectively show a top view and a cross-sectional view of deformed/collapsed substrate portions 114 during the fabrication of a DTC. The deformation and/or collapse of substrate portions 114 can distort the shapes of trenches 104, resulting in issues such as non-uniformity and/or bending in trenches 104. Such non-uniformity and/or bending in trenches 104 can cause structural defects and/or functional defects in the formed charge-storing structure. For example, as shown in FIGS. 1C, 1E, and 1F, the bended/collapsed substrate portion(s) 114 can cause the materials in the charge-storing structure to be deposited unevenly. The area between the electrodes (e.g., conductive layers 107A-107D) in a bended/deformed charge-storing stack can change, and the actual capacitance of the DTC can deviate from the originally designed capacitance. Also, conductive layers 107A-107D formed in a deformed trench 104 can be shorted with conductive layers 107A-107D in an adjacent trench 104, causing the DTC to malfunction or even fail. The structure and/or functionality of the DTC may thus be impaired.

As previously stated, large overlap between adjacent trenches can cause the substrate portion between the adjacent trenches to be susceptible to bending/collapse. For example, for trenches that are arranged close to one another (e.g., the spacing between adjacent trenches is no more than about ⅓ of the length of a trench in the first direction), a single substrate portion (e.g., between two adjacent trenches) having a length of about ⅔ of the length of a trench has an undesirably high chance of bending/collapse during a fabrication process. In this scenario, a single substrate portion having a length below ⅔ of the length of a trench has a much lower chance of bending/collapse during a fabrication process. An offset range between about ⅓ of the length and about ⅔ of the length can effectively reduce the overlap between adjacent trenches, as shown below in FIGS. 4A and 4B. For a DTC that has trenches arranged far away from one another (e.g., the spacing between adjacent trenches is above about ⅓ of the length of a trench in the first direction), an offset range can be larger, e.g., greater than ⅔ of the length of a trench, and can be calculated based partially on the value of the spacing to effectively reduce the overlap between adjacent trenches.

In some embodiments, pattern density (ratio of the area of trenches in a die over the total area of the die) may be employed to at least partially determine the range of an offset. In some embodiments, a nonzero offset between adjacent trenches can slightly decrease the pattern density of the die, compared to the existing pattern (e.g., the zero offset pattern shown in FIG. 1B). In some embodiments, a larger offset can result in a lower pattern density. The offset may be determined to have a range in which the pattern density is desirably high from lower bound to the upper bound. In some embodiments, the pattern density decreases to an undesirably low value when the offset is beyond the disclosed upper bound.

The present disclosure provides an integrated circuit (IC) and method for forming the IC. The IC includes a charge-storing device formed in a die. The charge-storing device can be a capacitor, such as a deep trench capacitor (DTC). The charge-storing device includes a charge-storing structure in a plurality of trenches, which extend into a substrate. The portion of the charge-storing device in a trench can be referred to as a charge-storing stack. The charge-storing stacks may include a plurality of groups. Each group may include multiple charge-storing stacks. The charge-storing stacks in a group extend lengthwise along a first direction. Unlike the existing pattern of trenches for forming a DTC, the length of a substrate portion between adjacent trenches is reduced, in respect to the widths of the trenches. For example, the trenches in a group of the present disclosure are not aligned along a second direction perpendicular to the first direction, e.g., are not fully overlapped in the first direction. For example, a first trench for forming a first charge-storing stack and a second trench for forming a second charge-storing stack in a group may have a nonzero offset in the first direction, and are thus partially overlapped along the first direction. The length of a substrate portion (e.g., along the first direction) between the first trench and the second trench can thus be reduced, compared to an existing pattern. The offset may be between about one third of the length of the first trench (or charge-storing stack) and about two thirds of the length of the first trench. In some embodiments, the offset is greater than about one half of the length of the first trench and smaller than two thirds of the length of the first trench. In some embodiments, the offset is greater than two thirds of the length of the first trench.

The offset can be calculated by pre-selecting a proportion of the length of the first trench, and/or based on a spacing between adjacent trenches in the first direction. In some embodiments, the group includes a third charge-storing stack extending lengthwise along the first direction. The third charge-storing stack and the first charge-storing stack may have a second offset that is greater than the offset. In various embodiments, the second offset is twice the offset. For example, the offset is about one third of the length of the first charge-storing stack, and the second offset is about two thirds of the length of the first charge-storing stack. In various embodiments, second offset is less than about twice the offset. In some embodiments, the charge-storing stacks in a same group has substantially the same length, width, and depth.

The disclosed range of offset can reduce the overlap between adjacent trenches, along the first direction, during the fabrication. That is, the length (e.g., along the first direction) of a substrate portion between adjacent trenches, can be reduced. For example, each trench extending lengthwise in the first direction may be partially overlapped with two adjacent trenches. In an example, the trenches have substantially the same dimensions (e.g., length, width, depth), and the ratio of length of a substrate portion to the width of the trenches is reduced, compared to the existing pattern of trenches. The offset can be determined such that the lengths of the two substrate portions, formed by the overlap between the trench and the two adjacent trenches, can be minimized/optimized. The substrate portions are thus not likely to deform as a result of stress during the fabrication process.

In some embodiments, the die includes a plurality of divisions, and charge-storing stacks may extend lengthwise in a respective direction in one (e.g., the first direction or the second direction) of the divisions. In some embodiments, the charge-storing stack in all divisions may extend lengthwise in the same direction (e.g., the first direction). In some embodiments, the charge-storing stack two divisions may extend lengthwise in perpendicular directions (e.g., the first direction and the second direction). A plurality of contact vias are located between adjacent charge-storing stacks (e.g., trenches). For example, a contact via is located between adjacent charge-storing stacks along a direction perpendicular to the direction the charge-storing stacks extend.

To form the charge-storing device, a plurality of trenches are first formed in a substrate. The substrate may be patterned to form a plurality of trenches arranged the disclosed pattern(s). A charge-storing structure may then be formed in the trenches. In some embodiments, the charge-storing structure includes at least two conductive layers, and a plurality of dielectric layers. For example, the dielectric layers and the conductive layers may be deposited alternatingly over the substrate (e.g., in the trenches). In some embodiments, the dielectric layer between adjacent conductive layers include a high-k dielectric material. The substrate is then patterned to form openings over the charge-storing stacks. Contact vias may be formed in the openings. The contact vias may electrically couple the charge-storing stacks with other parts of the IC.

The disclosed devices and methods can reduce the deformation of the trenches during the fabrication of a DTC. Even if the trenches have a high aspect ratio and a high length-to-width ratio, the substrate portion between adjacent trenches is less susceptible to bending or collapse. The disclosed patterns and methods can be employed to form devices/structures that include the formation of trenches of high aspect ratios and/or high length-to-width ratios. For example, DTCs formed from the trenches having aspect ratio of at least 10 and/or length-to-width ratio of at least 10 can be formed using the disclosed methods. In various embodiments, the trenches can have an aspect ratio of at least 20 and/or a length-to-width ratio of at least 15. The trenches formed using the disclosed methods are less likely to deform during fabrication. The devices formed based on the trenches, e.g., DTCs, are less susceptible to forming defects from the fabrication process.

FIGS. 2A-2D illustrate different patterns of trenches for the formation of a DTC, according to some aspects of the present disclosure. Patterns 200, 201, 202, and 203, shown in FIGS. 2A-2D, may be formed for the formation of a DTC. In some embodiments, a charge-storing structure is formed in the trenches of patterns 200, 201, 202, and 203. In some embodiments, patterns 200, 201, 202, and 203 are each formed in one or more dies of an IC. In some embodiments, one or more of patterns 200, 201, 202, and 203 are formed in the same die. In some embodiments, a die includes one or more DTCs formed from the trenches in patterns 200, 201, 202, and/or 203. It should be noted that, FIGS. 2A-2D are merely employed to illustrate the pattern of trenches, and other structures included in a DTC are omitted for ease of illustration. For ease of illustration, the trenches in pattens 200, 201, 202, and 203 have substantially the same width and depth. In some other embodiments, trenches may have different widths and/or depths. In patterns 200, 201, 202, and 203, offsets are calculated in various ways, depending on the arrangement of the trenches. The length of a substrate portion between adjacent trenches can be minimized/optimized to reduce structural deformation of the trenches, as well as maintaining desirably high pattern density (ratio of the area of trenches in a die over the total area of the die).

In some embodiments, an aspect ratio (e.g., the depth-to-width ratio) of each trench in the embodiments of the present disclosure is at least 10, such as between about 12 and 20. A length-to-width ratio of each trench in the embodiments of the present disclosure is at least 10, such as between about 11 and about 26.

Figure 2A:
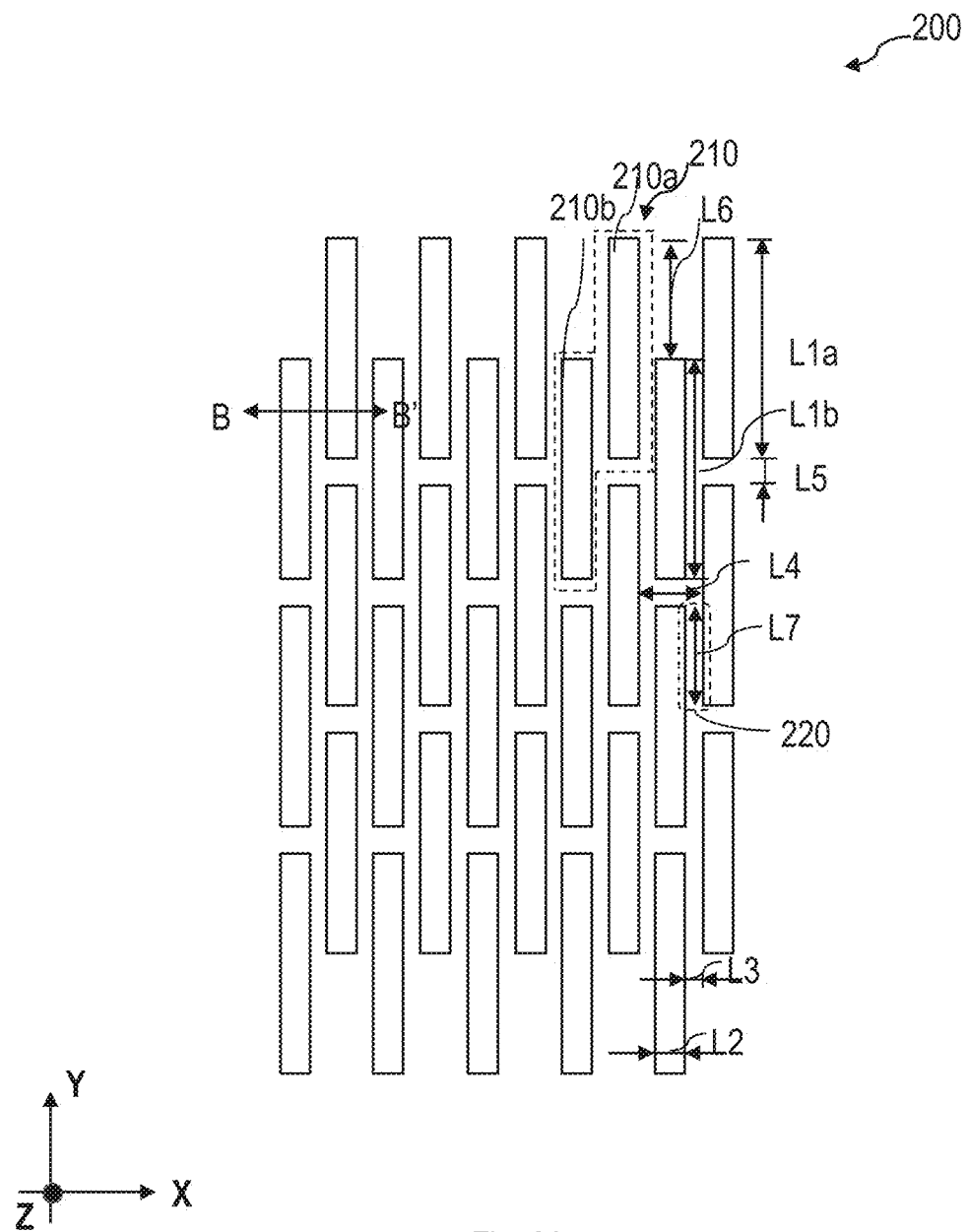
FIGS. 2A-2D each illustrates an exemplary pattern of trenches for forming a DTC, according to various aspects of the present disclosure.

FIG. 2A illustrates a pattern 200 in which a group 210 repeats in the x-direction and y-direction. As shown in FIG. 2A, group 210 includes a first trench 210a and a second trench 210b, extending lengthwise in the y-direction. First trench 210a may be adjacent to second trench 210b in the x-direction. In some embodiments, first trenches 210a of a plurality of groups 210 are aligned with one another in the x-direction and y-direction, and second trenches 210b of a plurality of groups 210 are aligned with one another in the x-direction and the y-direction. First trench 210a may have a length L1a along the y-direction, and second trench 210b may have a length L1b along the y-direction. First trench 210a and second trench 210b may each have a width L2 along the x-direction, and a depth d (not shown) in the z-direction. A smallest spacing L3 between two adjacent trenches in the x-direction may be no more than about 10% of L1a. A largest spacing L4 between two adjacent trenches in the x-direction may be less than or equal to about 25% of L1a or L1b. For example, spacing L4 between trenches is about 20% of L1a. A spacing L5 between two adjacent trenches in the y-direction may be about 20% of L1a. In some embodiments, L1a is about the same as L1b. For example, all trenches have the same length L. As examples, L1a and L1b (or L) may each be about 3 μm, L4 and L5 may each be about 0.6 μm, and L3 may be less than 0.3 μm. It should be noted that, in some other embodiments, L1a and L1b may be different.

In some embodiments, first trench 210a and second trench 210b may have an offset L6 along the y-direction. That is, an end surface of the first trench 210a is shifted along the y-direction by the offset L6 from an end surface of the second trench 210b. Offset L6 may be any nonzero value that is sufficiently large to reduce a length L7 (e.g., along the y-direction) of a substrate portion 220 between adjacent first trench 210a and second trench 210b. In some embodiments, L6 is at least ⅓ of L1a. For example, L6 may be between about ⅓ of L1a and about L1a. Specifically, L6 may be between about ⅓ of L1a and about ⅔ of L1a. L7 may be between about 33% of L1a and 67% of L1a. In some embodiments, L6 is calculated as ½(L1a+delta), where delta can be zero or a nonzero value. For example, delta is equal to L5, and L6 is equal to ½(L1a+L5). For example, L1a may be about 3 μm, L5 may be about 0.6 μm, and L6 may be about 1.8 μm. In various embodiments, the value of delta may be predetermined to be any suitable value and may not be limited to any parameters of pattern 200.

In the example shown in FIG. 2A, L5 is no more than ⅓ of L1a, such that the trenches in pattern 200 are closely arranged. The value of L6 can be calculated using a proportion of L1a or using the equation of ½(L1a+L5). In this scenario, the spacing (i.e., L5) between adjacent trenches plays a relatively small role in determining the value of the offset (i.e., L6). In some other embodiments, although not shown, L5 may greater than one third ⅓ of L1a, such that the trenches are relatively sparsely arranged in the y-direction. The value of L6 can be calculated using the equation of ½(L1a+L5) rather than a proportion of L1a. In this scenario, the spacing (i.e., L5) between adjacent trenches plays a bigger role in determining the value of the offset (i.e., L6). For example, when the trenches are relatively sparsely arranged (e.g., L5 being greater than ⅓ of L1a), the offset obtained from the equation can be greater than ⅔ of L1a, and L7 may be even smaller than ⅓ of L1a. Thus, the length (e.g., L7) of a substrate portion (e.g., in the x-direction) between adjacent trenches can still be minimized. The substrate portion is less susceptible to bending/collapse. However, the value of the offset (e.g., L6) can be calculated using equation ½(L1a+delta) for any range/value of L5, by determining a suitable value of delta.

Figure 2B:
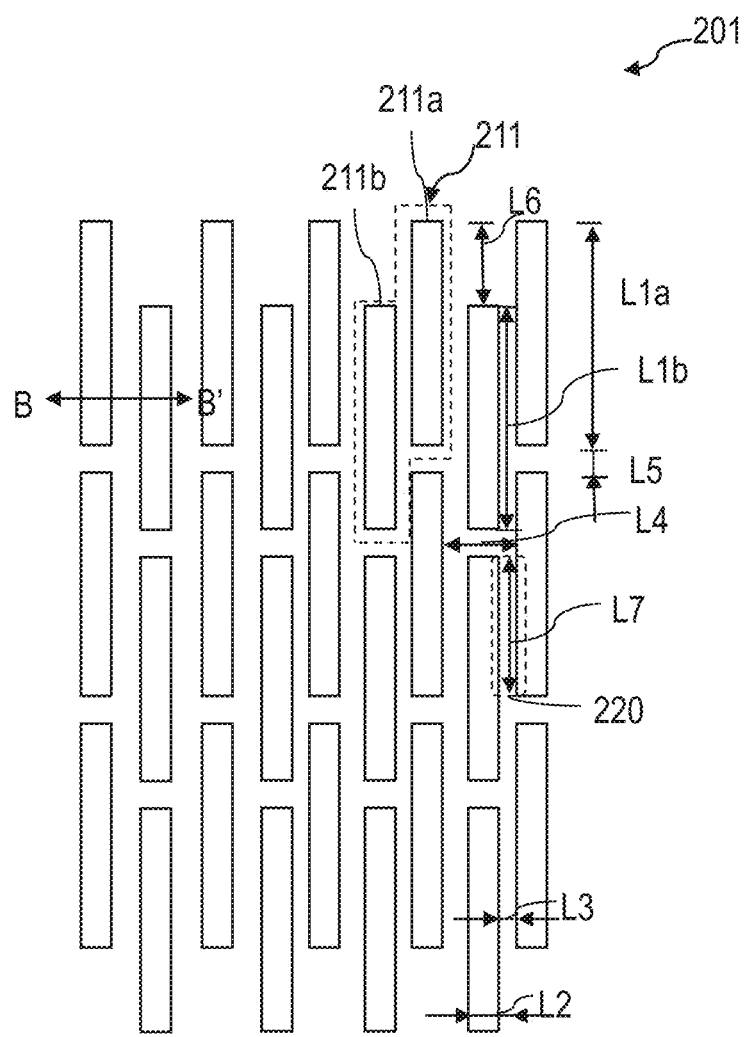

FIG. 2B illustrates a pattern 201 in which a group 211 repeats in the x-direction and y-direction. As shown in FIG. 2B, group 211 includes a first trench 211a and a second trench 211b extending lengthwise in the y-direction. The trenches may have the same or similar dimensions as of those in pattern 200. Spacing L5 between adjacent trenches (e.g., adjacent first trenches 210a and adjacent second trenches 210b) in the y-direction is no more than ⅓ of L1a. Different from pattern 200, in pattern 201, offset L6 between first trench 211a and second trench 211b in the y-direction may be at least ⅓ of L1a and no more than ½(L1a+L5). Pattern 201 shows an example of the smallest offset required between adjacent trenches when the spacing (i.e., L5) between adjacent trenches (e.g., in the y-direction) is small (e.g., no more than ⅓ of L1a). For example, L6 may be about ⅓ of L1a, ⅔ of L1a, etc. In some embodiments, L6 is about ⅓ of L1a, and L7 is about 67% of L1a. In some embodiments, the values of L6 may be determined based on a proportion (e.g., ⅓) of L1a or based on equation ½(L1a+delta), where delta is equal to (-⅓L1a).

Figure 2C:
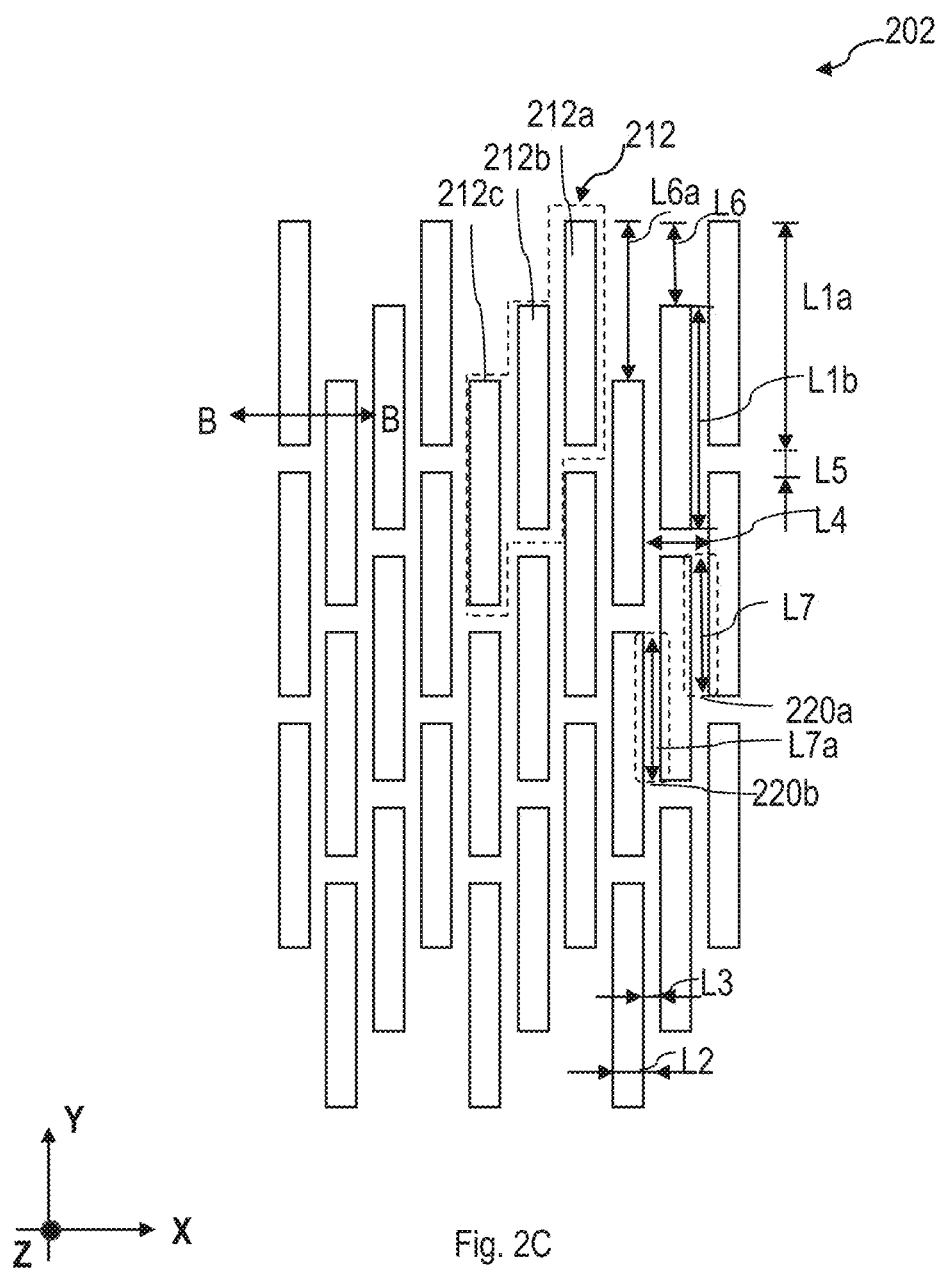

FIG. 2C illustrates a pattern 202 in which a group 212 repeats in the x-direction and y-direction. As shown in FIG. 2C, group 212 includes a first trench 212a, a second trench 212b, and a third trench 212c, extending lengthwise in the y-direction. Second trench 212b may be adjacent to first trench 212a in the x-direction, and third trench 212c may be adjacent to second trench 212b in the x-direction. In some embodiments, first trenches 212a of a plurality of groups 212 are aligned with one another in the x-direction and y-direction, second trenches 212b of a plurality of groups 212 are aligned with one another in the x-direction and the y-direction, and third trenches 212c of a plurality of groups 212 are aligned with one another in the x-direction and the y-direction. Along the y-direction, first trench 212a, second trench 212b, and third trench 212c respectively has a length L1a, L1b, and L1c. First trench 212a, second trench 212b, and third trench 212c may each have a width L2 along the x-direction, and a depth d (not shown) in the z-direction. A smallest spacing L3 between two adjacent trenches in the x-direction may be no more than about 10% of L1a. A largest spacing L4 between two adjacent trenches in the x-direction may be less than or equal to about 25% of L1a. For example, spacing L4 may be about 20% of L1a. A spacing L5 between two adjacent trenches in the y-direction may be about 20% of L1a. In some embodiments, L1a, L1b, and L1c have substantially the same length. For example, all trenches have the same length L. As examples, L1a, L1b, and L1c (or L) may each be about 3 µm, L4 and L5 may each be about 0.6 µm, and L3 may be less than 0.3 µm. It should be noted that, in some other embodiments, L1a, L1b, and L1c may be different.

In some embodiments, first trench 212a and second trench 212b may have an offset L6 along the y-direction, and third trench 212c and first trench 212a may have an offset L6a along the y-direction. Offsets L6 and L6a may each be any nonzero value that is sufficiently large to reduce lengths L7 and L7a (e.g., along the y-direction) of substrate portions 220a and 220b. In some embodiments, L7 represents the length of substrate portion 220a between adjacent first trench 212a and second trench 212b, and L7a represents the length of substrate portion 220b between adjacent second trench 212b and third trench 212c. In some embodiments, L6 and L6a are each at least ⅓ of L1a. For example, L6 and L6a are each between about ⅓ of L1a and L1a. In some embodiments, L6a may be greater than L6, and L6 and (L6a-L6) are each smaller than about ½ of L1a. L7 and L7a may each be between about 67% of L1a and ½ of L1a. In some embodiments, L6 is about ⅓ of L1a, L6a is about ⅔ of L1a, and L7 and L7a may each be about 67% of L1a. In other words, first trench 212a, second trench 212b, and third trench 212c may be evenly spaced (e.g., by ⅓ of L1a) in the y-direction. In some embodiments, the values of L6 and L6a may be determined based on proportions (e.g., ⅓ and ⅔) of L1a or based on equation ½(L1a+delta), where delta is equal to (−⅓L1a) for L6 and (⅓L1a) for L6a.

Figure 2D:
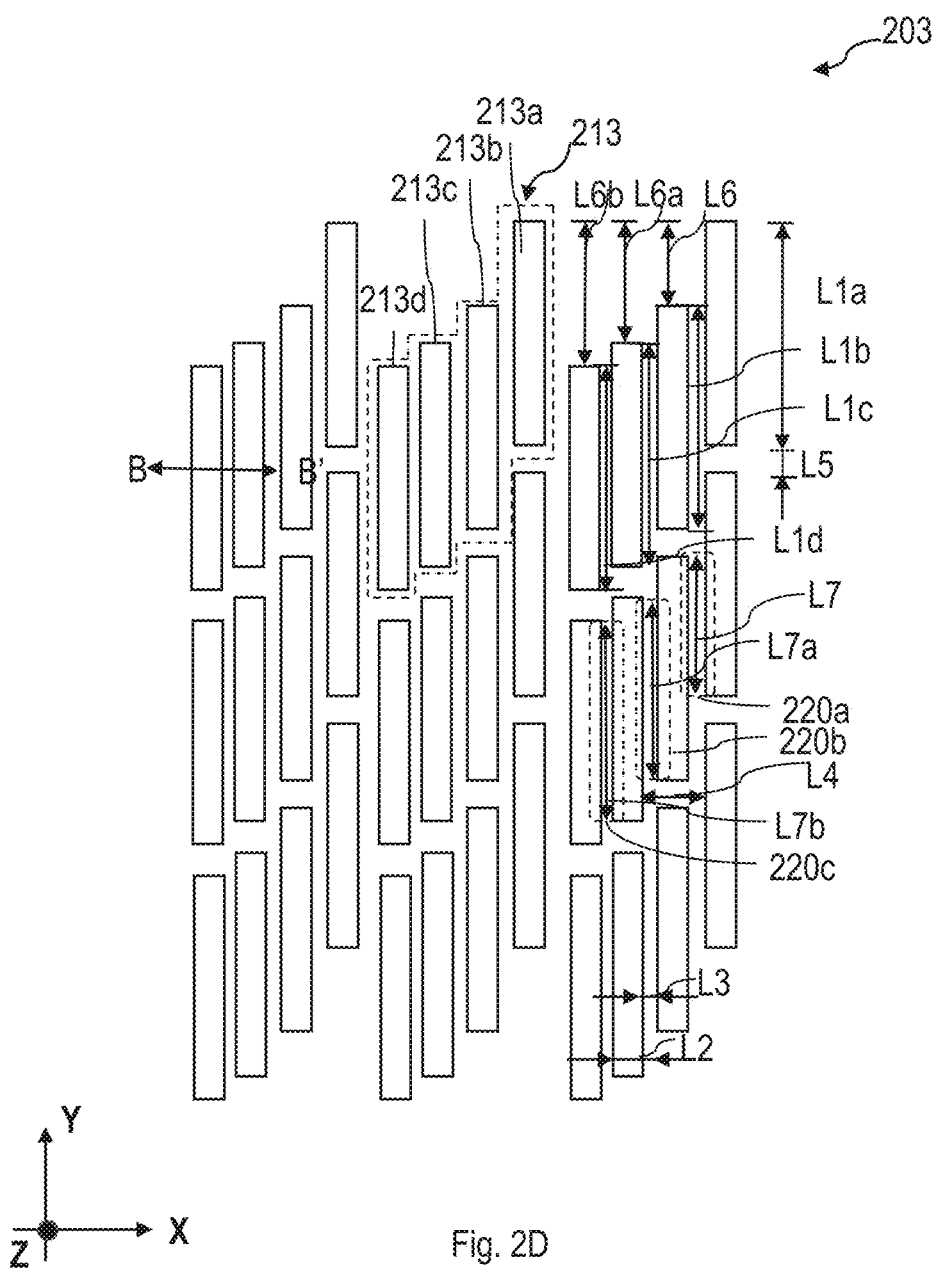

FIG. 2D illustrates another pattern 203 in which a group 213 repeats in the x-direction and y-direction. As shown in FIG. 2D, group 213 includes a first trench 213a, a second trench 213b, a third trench 213c, and a fourth trench 213d, extending lengthwise in the y-direction. Second trench 213b may be adjacent to first trench 213a in the x-direction, third trench 213c may be adjacent to second trench 213b in the x-direction, and fourth trench 213d may be adjacent to third trench 213c in the x-direction. In some embodiments, first trenches 213a of a plurality of groups 213 are aligned with one another in the x-direction and y-direction, second trenches 213b of a plurality of groups 213 are aligned with one another in the x-direction and the y-direction, third trenches 213c of a plurality of groups 213 are aligned with one another in the x-direction and the y-direction, and fourth trenches 213d of a plurality of groups 213 are aligned with one another in the x-direction and the y-direction. Along the y-direction, first trench 213a, second trench 213b, third trench 213c, and fourth trench 213d respectively has a length L1a, L1b, L1c, and L1d. First trench 213a, second trench 213b, third trench 213c, and fourth trench 213d may each have a width L2 along the x-direction, and a depth d (not shown) in the z-direction. A smallest spacing L3 between two adjacent trenches in the x-direction may be no more than about 10% of L1a. A largest spacing L4 between two adjacent trenches in the x-direction may be less than or equal to about 25% of L1a. For example, spacing L4 may be about 20% of L1a. A spacing L5 between two adjacent trenches in the y-direction may be about 20% of L1a. For ease of illustration, in some embodiments, L1a, L1b, L1c, and L1d have substantially the same length. For example, all trenches have the same length L. As examples, L1a, L1b, L1c, and L1d (or L) may each be about 3 µm, L4 and L5 may each be about 0.6 µm, and L3 may be less than 0.3 µm. It should be noted that, in some other embodiments, L1a, L1b, L1c, and L1d may be different.

Pattern 203 illustrates an example in which the values of offsets in a group of trenches can be flexibly designed to meet design requirements and reduce bending/collapse. In some embodiments, first trench 213a and second trench 213b may have an offset L6 along the y-direction, third trench 213c and first trench 213a may have an offset L6a along the y-direction, and fourth trench 213d and first trench 213a may have an offset L6b along the y-direction. Offsets L6, L6a, and L6b may each be any nonzero value that is sufficiently large to reduce lengths L7, L7a, and L7b (e.g., along the y-direction) of substrate portions 220a, 220b, and 220c. In some embodiments, L7 represents the length of substrate portion 220a between adjacent first trench 213a and second trench 213b, L7a represents the length of substrate portion 220b between adjacent second trench 213b and third trench 213c, and L7b represents the length of substrate portion 220c between adjacent third trench 213c and fourth trench 213d. In some embodiments, L6, L6a, and L6b are each at least ⅓ of L1a. For example, L6, L6a, and L6b are each between about ⅓ of L1a and L1a. In some embodiments, L6, L6a, and L6b are each smaller than about ½ of L1a. L6a may be greater than L6, and L6b may be greater than L6a. L7, L7a, and L7b may each be between about 67% of L1a and L1a. In some embodiments, L6 is about ⅓ of L1a, L6a is about 1.2/3 of L1a, and L6b is about 1.3/3 of La. In other words, first trench 213a, second trench 213b, third trench 213c, and fourth trench 213d may not be evenly spaced in the y-direction. In some embodiments, the values of L6, L6a, and Lab may be determined based on proportions (e.g., ⅓, 1.2/3, and 1.3/3) of L1a or based on equation ½(L1a+delta), where delta is equal to (−⅓L1a) for L6, (−0.2L1a) for L6a, and (−0.4/3L1a) for L6b.

As shown in FIGS. 2A-2D, the value of an offset can be determined based on a proportion of L1a and/or delta. In some embodiments, delta is equal to L5. In some embodiments, when L5 is less than or equal to ⅓ of L1a, the offset may be determined to be a proportion of L1a and/or ½ (L1a+L5), and is in a range of about ⅓ of L1a and about ⅔ of L1a. In some embodiments, when L5 is greater than ⅓ of L1a, the offset may be determined using ½(L1a+L5), which can be greater than ⅔ of L1a. That is, when trenches are spaced far away from one another in the y-direction, the spacing between adjacent trenches in the y-direction can be used to determine the value of an offset.

It should be noted that, the number of trenches in a group in a pattern may not be limited by the embodiments of the present disclosure. For example, pattern 203 may include three trenches (e.g., first trench 213a, second trench 213b, and third trench 213d) unevenly spaced in the y-direction. In pattern 200, group 210 may optionally include one or more trenches spaced evenly or unevenly in the extending direction (e.g., the y-direction), and between first trench 210a and second trench 210b. The offset(s) between the one or more trenches and first trench 210a may be at least ⅓ of L1a. In other words, in a group of trenches with about the same length, the smallest offset between trenches in the extending direction is at least about ⅓ of the length. If the spacing between adjacent trenches in the extending direction is no more than ⅓ of the length, the largest offset between trenches in the extending direction can be about ⅔ of the length. If the spacing between adjacent trenches in the extending direction is greater than ⅓ of the length, the large offset between trenches in the extending direction can be greater than ⅔ of the length, or even up to about the length.

It should also be noted that, the actual dimensions of the trenches are not limited by the embodiments of the present disclosure. In some embodiments, it might be determined that the length of substrate portion between the first trench and another trench in the same group to the length of the first trench is no more than about ⅔ of the length of the first trench. For example, L7/L1a is no more than about ⅔, (L1a-L6)/L1a is no more than about ⅔, (L1a-L6a) is no more than about ⅔, (L1a-L6b) is no more than about ⅔, etc.

Thus, the overlap between adjacent trenches along the extending direction such that the length of a substrate portion, formed by the overlapping of adjacent trenches along a direction perpendicular to the extending direction, can be reduced. In other words, the length of a substrate portion may be at most about ⅔ of L1a. Compared to the existing pattern, in which the adjacent trenches are aligned with each other in the y-direction (e.g., completely overlapped of the length of a substrate portion being about L1a), adjacent trenches are at most partially overlapped in the y-direction. A substrate portion between adjacent trenches has more support in the x-direction, and can thus be less susceptible to high stress during the fabrication. The trenches are thus less susceptible to deformation (e.g., bending) and/or collapse during the fabrication.

Figure 3A:
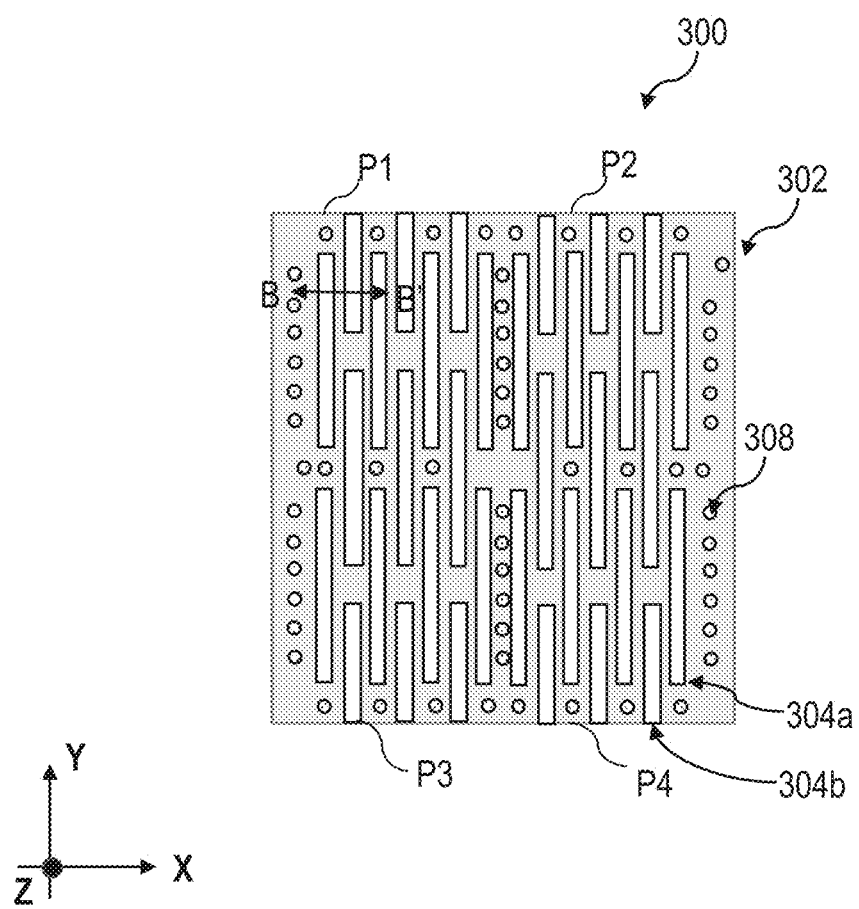
FIGS. 3A and 3B each illustrates an exemplary pattern of trenches and contact vias for forming a DTC, according to various aspects of the present disclosure.
Figure 3B:
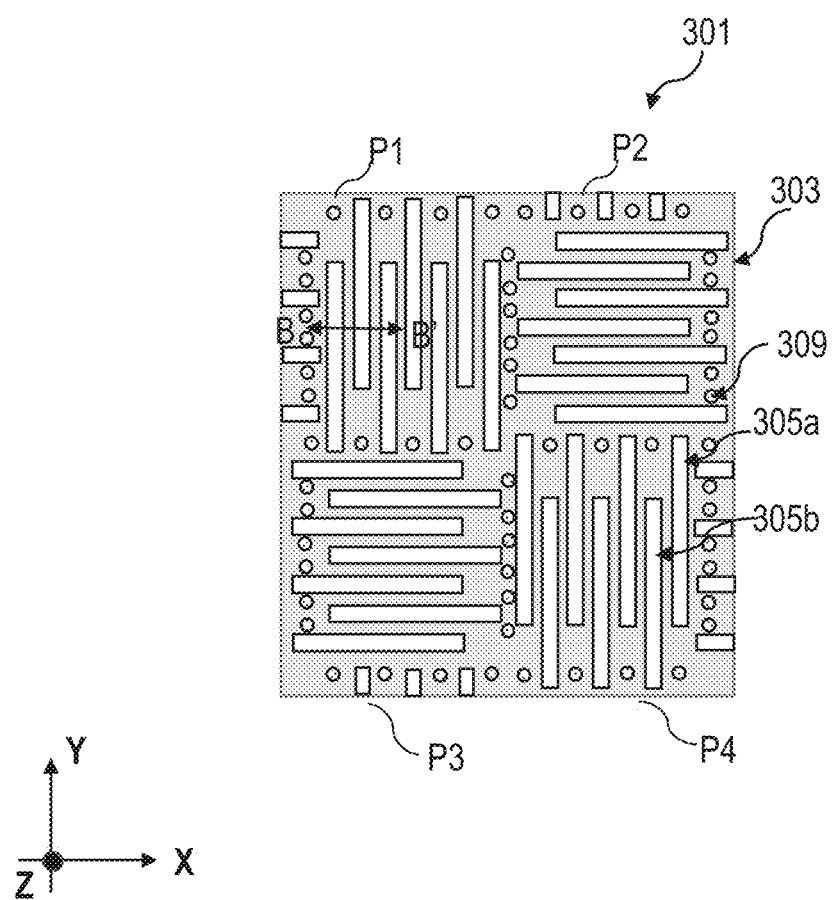

FIGS. 3A and 3B illustrate patterns of trenches and contact vias in a DTC unit, according to some aspects of the present disclosure. The patterns in FIGS. 3A and 3B may be employed to form the same DTC, or different DTCs. For example, a DTC may be formed from trenches and contact vias arranged in pattern 300 and/or pattern 301. For ease of illustration, only trenches and locations of the contact vias are shown in patterns 300 and 301. In some embodiments, trenches in patterns 300 and 301 have substantially the same dimensions, e.g., length, width, and depth. Adjacent trenches in patterns 300 and 301 are separated by a spacing in the extending direction.

Pattern 300 may represent a pattern of the trenches and locations of contact vias in a DTC unit 302. As shown in FIG. 3A, pattern 300 includes a group of a first trench 304a and second trench 304b, extending lengthwise in the y-direction, similar to that of pattern 200. For example, first trenches 304a are aligned with one another in the x-direction and in the y-direction, and second trenches 304b are aligned with one another in the x-direction and in the y-direction. An offset between first trench 304a and second trench 304b may be between about ½ of the length and about ⅔ of the length in the y-direction. For example, patten 300 may be similar to pattern 200, and the offset may be about ½(length+spacing). A contact via, represented by a location 308, may be located between adjacent trenches (e.g., adjacent second trenches 304b) in the x-direction. Location 308 may be located between adjacent first trenches 304a along the y-direction and between adjacent second trenches 304b along the x-direction. In some embodiments, DTC unit 302 may include a plurality of (e.g., four) divisions P1, P2, P3, and P4. In each division, a plurality of trenches (e.g., 304a and 304b) are surrounded by a plurality of contact vias (represented by locations 308 of contact vias) in the x-direction and in the y-direction. In some embodiments, as shown in FIG. 3A, the trenches (e.g., 304a and 304b) extend lengthwise in the same direction, e.g., the y-direction.

Pattern 301 may represent a pattern of the trenches and locations of contact vias in a DTC unit 303. As shown in FIG. 3B, pattern 301 includes a group of a first trench 305a and second trench 305b. In some embodiments, DTC unit 303 may include a plurality of (e.g., four) divisions P1, P2, P3, and P4. The trenches (e.g., 305a and 305b) in divisions P1 and P4 extend lengthwise in the y-direction, and the trenches in divisions P2 and P3 extend lengthwise in the x-direction. The arrangement of trenches in a respective pattern may be similar to that of pattern 201. In each division, a plurality of trenches (e.g., 305a and 305b) are surrounded by a plurality of contact vias (represented by locations 309 of contact vias) in the x-direction and in the y-direction. In some embodiments, a contact via has a diameter of about 0.1 μm to about 0.2 μm, e.g., about 0.14 μm. In each division, first trenches 305a are aligned with one another in the x-direction and in the y-direction, and second trenches 305b are aligned with one another in the x-direction and in the y-direction. An offset between first trench 305a and second trench 305b may be about ⅓ of the length in the respective extending direction. A contact via, represented by a location 309, may be located between adjacent trenches (e.g., adjacent first trenches 305a or adjacent second trenches 305b) in the x-direction. Location 309 may also be located between adjacent first trenches 305a or adjacent second trenches 305b.

Figure 4A:
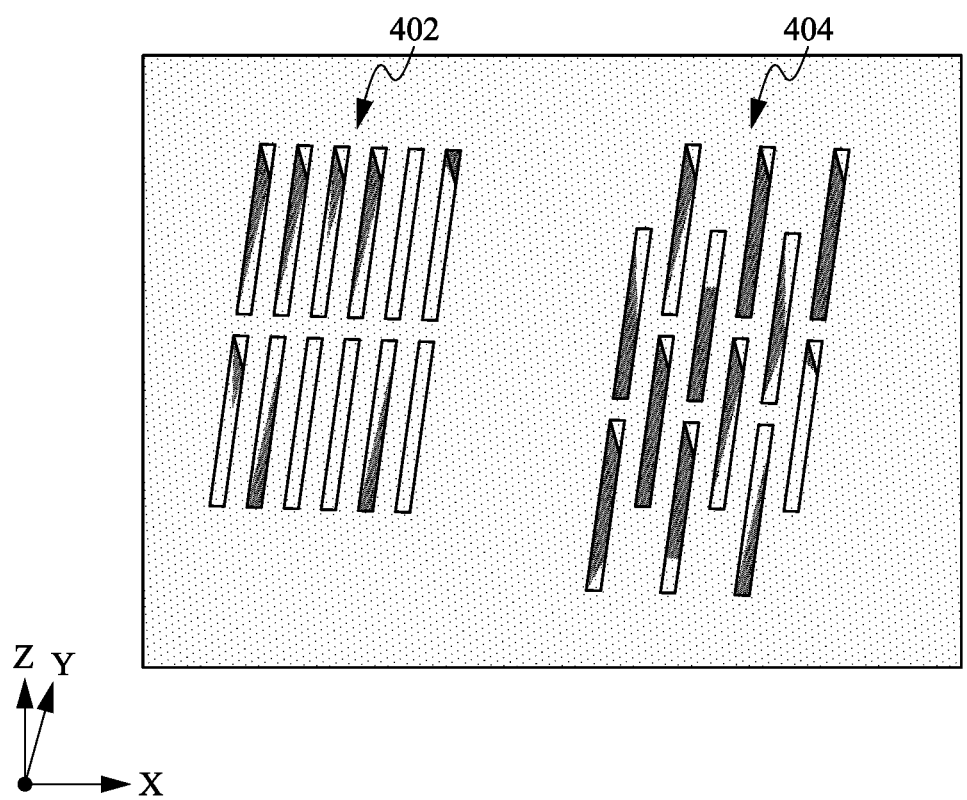
FIG. 4A illustrates an existing pattern of trenches and a disclosed exemplary pattern of trenches, according to various aspects of the present disclosure.
Figure 4B:
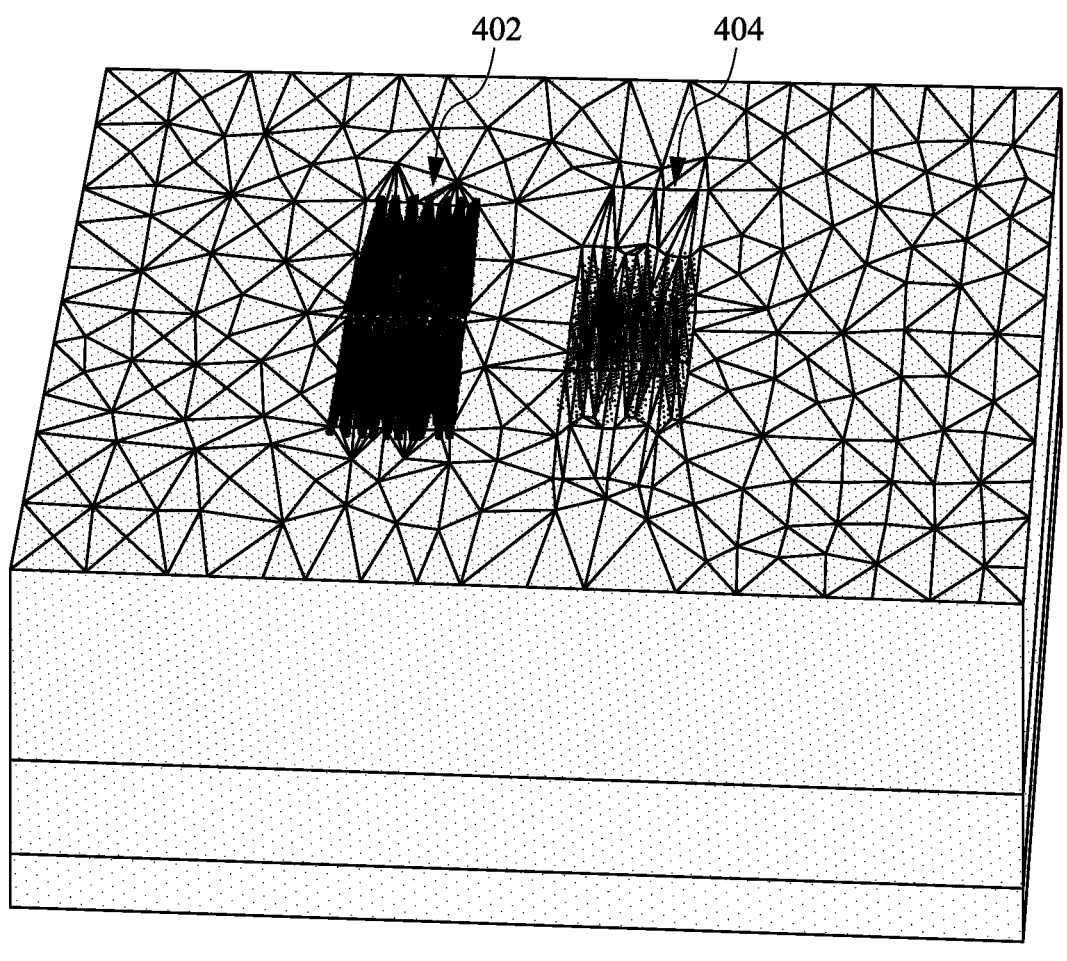
FIG. 4B illustrates simulated stress profiles of the existing pattern of trenches and a disclosed exemplary pattern of trenches in FIG. 4A, according to various aspects of the present disclosure.

FIG. 4A and FIG. 4B illustrate simulated stress profiles of an existing pattern of trenches and an exemplary pattern of trenches, according to some aspects of the present disclosure. For ease of illustration, all trenches in patterns 402 and 404 have the same dimensions, e.g., length, width, and depth. Pattern 402 represents an existing pattern in which trenches extend lengthwise in the y-direction. In pattern 402, adjacent trenches are completely overlapped (or aligned) with each other in the x-direction, similar to the pattern of trenches shown in FIG. 1B. In pattern 404, adjacent trenches have an offset of about ½ of the length of the trenches, similar to pattern 200. The trenches, arranged in both patterns 402 and 404, may be formed in the simulation environment, and a heat flow may be applied on the trenches. The heat flow may cause stress in the materials of the trenches, due to structures of the trenches and the thermal coefficient differences of the materials. It has shown that, in FIG. 4B, the trenches in pattern 402 (in deeper shade) is subject to higher stress than those in pattern 404 (in lighter shade).

Figure 5A:
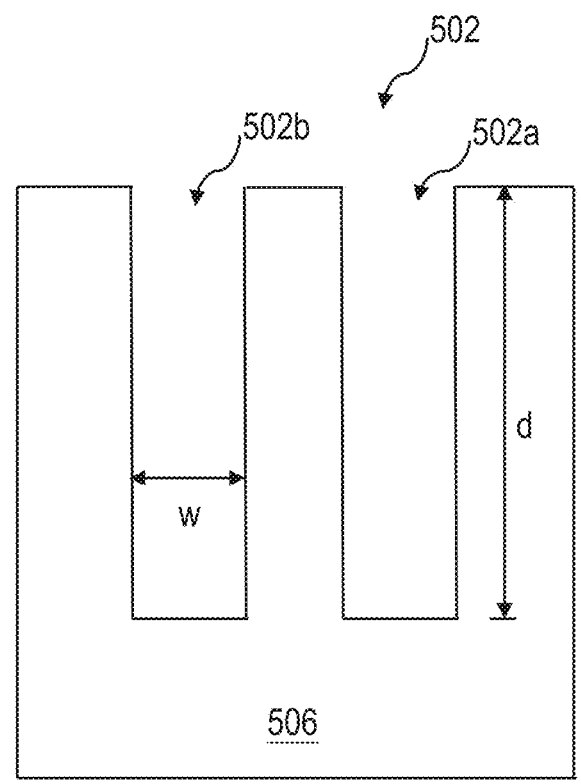
FIGS. 5A and 5B illustrate cross-sectional views of a DTC during various stages of a fabrication process, according to various aspects of the present disclosure.
Figure 5A:
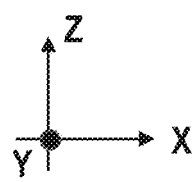
Figure 5B:
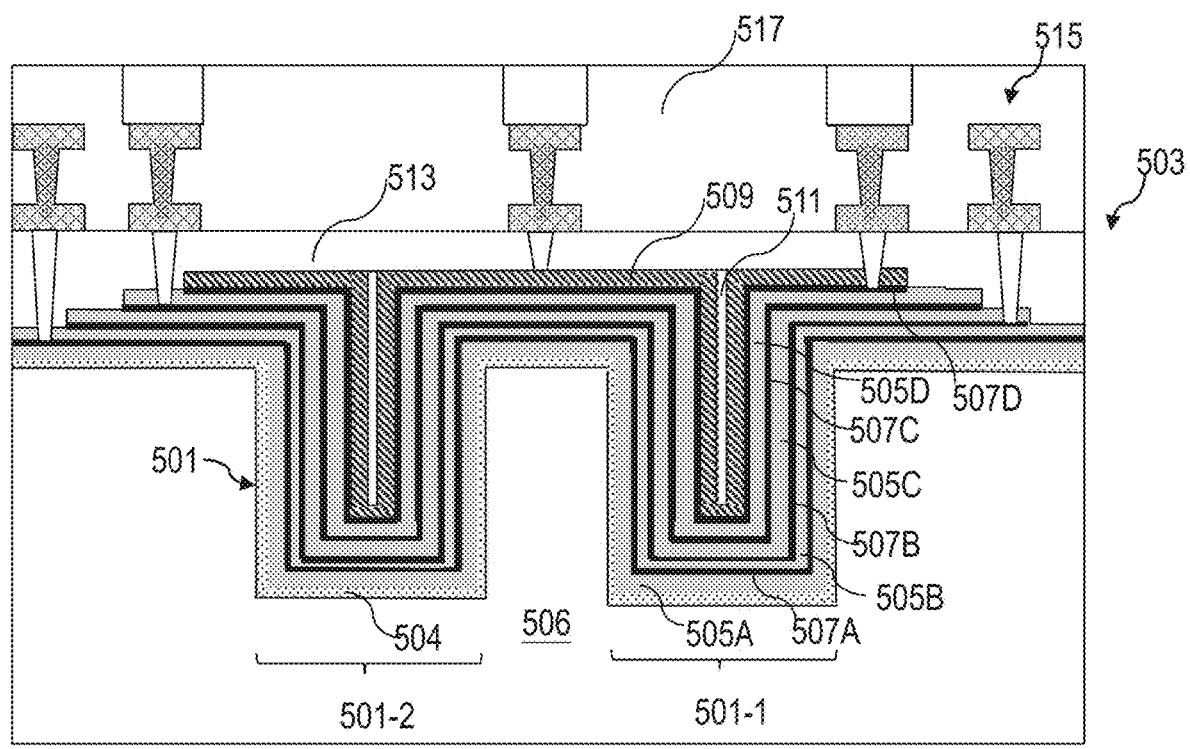
Figure 5B:
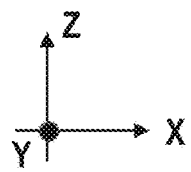
Figure 6:
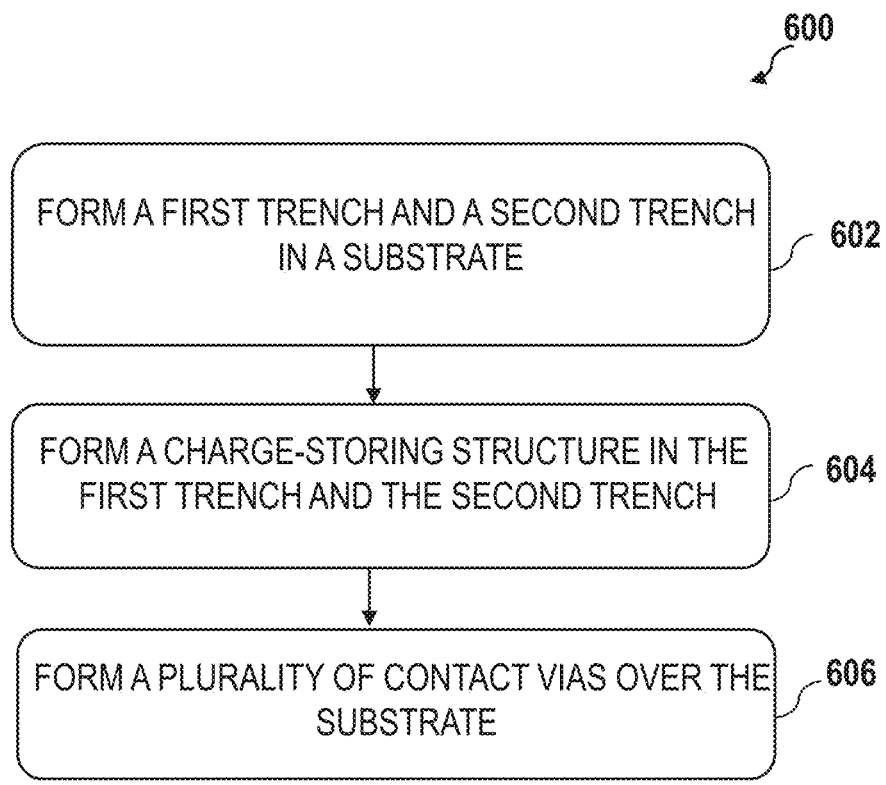
FIG. 6 is a flowchart of a method for forming a DTC, according to various aspects of the present disclosure.

FIGS. 5A and 5B illustrate cross-sectional views of part of a DTC at different stages of a fabrication process, according to some aspects of the present disclosure. A method 600 of forming a DTC is illustrated in the flowchart in FIG. 6. Method 600 is merely an example, and is not intended to limit the present disclosure beyond what is explicitly recited in the claims. Additional operations can be provided before, during, and after the method 600, and some operations described can be replaced, eliminated, or moved around for additional embodiments of method 600. Method 600 will be described in more detail below.

Method 600 includes a block 602 where a first trench and a second trench are formed in a substrate. FIG. 5A illustrates a corresponding structure.

As shown in FIG. 5A, a first trench 502a and a second trench 502b are formed in a substrate 506. In some embodiments, first trench 502a and second trench 502b may be in a group 502. In some embodiments, FIG. 5A may be a cross-sectional view along the B-B' direction in pattern 200, 201, 202, 203, 300, or 301. Referring back to FIGS. 2C and 2D, more than two trenches (not shown) may be formed in group 502. In some embodiments, a plurality of groups 502 are formed repeating in substrate 506. In some embodiments, the trenches formed in patterns 200, 201, 202, and 203 are each an example of the trenches formed by method 600.

A photolithography process and a suitable etching process (e.g., dry etch and/or wet etch) may be performed to pattern substrate 506. A photomask corresponding to pattern 200, 201, 202, 203, 300, or 301 of trenches may be used in the photolithography process. First trench 502a and second trench 502b may extend into substrate 506, and may each have a side surface substantially along the z-direction, and a bottom surface substantially along the x-y plane. In some embodiments, first trench 502a and second trench 502b extend lengthwise in the y-direction, and each has a respective length in the y-direction. First trench 502a and second trench 502b may each have a respective width (w), and may each have a respective depth(d). In some embodiments, the length-to-width ratio of each of first trench 502a and second trench 502b may each be at least 10, such as between about 12 and about 20, and the depth-to-width ratio (i.e., aspect ratio) of each of first trench 502a and second trench 502b may each be at least 10, such as between about 11 and about 16.

Substrate 506 may include, for example, bulk silicon, doped or undoped, and/or an active layer of a semiconductor-on-insulator (SOI) substrate. A SOI substrate comprises a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, substrate 506 may include another elementary semiconductor (e.g., germanium), a compound semiconductor (e.g., silicon carbide, gallium arsenic, gallium phosphide, indium phosphide, indium arsenide, and/or indium antimonide), an alloy semiconductor (e.g., SiGe, GaAsP, AlInAs, AlGaAs, GaInAs, GaInP, and/or GaInAsP), or combinations thereof. Other substrates, such as multi-layered or gradient substrates, may also be used.

Referring back to FIG. 6, method 600 includes a block 604 where a charge-storing structure is formed in the first trench and the second trench. FIG. 5B illustrates a corresponding structure.

As shown in FIG. 5B, a charge-storing structure 501 is formed in first trench 502a and second trench 502b, and a charge-storing stack is formed in each of first trench 502a and second trench 502b. As shown in FIG. 5B, a charge-storing stack 501-1 is formed in first trench 502-a and a charge-storing stack 501-2 is formed in second trench 502-b. In some embodiments, a liner layer 504 is formed over substrate 506, along sidewalls and bottom surfaces of first trench 502a and second trench 502b. In some embodiments, liner layer 504 may comprise a dielectric material, such as silicon oxide, silicon oxynitride (SiON), silicon carboxynitride (SiCON), a combination thereof, or the like. Liner layer 504 may be formed using atomic layer deposition (ALD), chemical vapor deposition (CVD), a combination thereof, or the like. In some embodiments, liner layer 504 has a thickness between about 5 nm and about 100 nm. In some embodiments, liner layer 504 is patterned to expose a top surface of the substrate 506. In some embodiments, the patterning process may comprise suitable photolithography and etching methods.

In some embodiments, after forming liner layer 504, dielectric layers 505A, 505B, 505C, and 505D, and conductive layers 507A, 507B, 507C, and 507D, are formed in the trenches (e.g., first trench 502a and second trench 502b) in an alternating manner. Conductive layers 507A-507D may be also referred to as capacitor electrodes 507A-507D. In some embodiments, each of conductive layers 507A-507D may include a conductive material such as doped silicon, poly silicon, copper, tungsten, an aluminum or copper alloy, titanium, titanium nitride, tantalum, tantalum nitride, a combination thereof, or the like, and may be formed using plating, physical vapor deposition (PVD), ALD, CVD, a combination thereof, or the like. In some embodiments, each of the conductive layers 507A-507D has a thickness between about 10 nm and about 100 nm. In some embodiments, each of dielectric layers 505A-505D may include a high-K dielectric material such as aluminum oxide, zirconium oxide, a combination thereof, a multilayer thereof, or the like. In some embodiments, each of dielectric layers 505A-505D include a multilayer having two layers of zirconium oxide and a layer of aluminum oxide interposed between the layers of zirconium oxide. In some embodiments, each of the dielectric layers 505A-505D has a thickness between about 0.3 nm and about 50 nm.

In some embodiments, after forming conductive layer 505A over dielectric layer 505A and liner layer 504, conductive layer 507A is patterned to expose portions of a top surface of liner layer 504. In some embodiments, the patterning processes may comprise suitable photolithography and etching methods. Optionally, spacers (not shown) are formed along opposite sidewalls of conductive layer 505A. Each of the spacers may include a dielectric material such as silicon oxide, silicon nitride, silicon oxynitride, a combination thereof, a multilayer thereof, or the like. In some embodiments, the spacers are formed by blanket depositing a dielectric material using ALD, CVD, a combination thereof, or the like. Anisotropic etching can be used to remove horizontal portions of the dielectric material. The remaining vertical portions of the dielectric material form the spacers. In some embodiments, each of the spacers has a width between about 5 nm and about 50 nm. Subsequently, dielectric layer 505B is formed over conductive layer 507A and the spacers. In some embodiments, dielectric layer 505B is patterned to remove portions of the dielectric layer 505B extending beyond the spacers of conductive layer 507A. In some embodiments, the patterning processes may comprise suitable photolithography and etching methods.

Next, conductive layer 507B is blanket formed over the dielectric layer 505B and substrate 506. Conductive layer 507B is then patterned to expose portions of a top surface of dielectric layer 505B. Spacers may be formed on the opposite sidewalls of the conductive layer 507B after the patterning. Similarly, dielectric layers 505C and 505D and conductive layers 507B and 507D are formed and patterned, and spacers are formed on the opposite sidewalls of each of conductive layers 507C and 507D. The fabrication process and materials of the spacers may be similar to those of conductive layer 507A and dielectric layer 505A, and the detailed description is not repeated herein.

After forming conductive layers 507A-507D and dielectric layers 505A-505D over substrate 506, a dielectric material 509 is formed to fill the remaining portions of the trenches (e.g., first trench 502a and second trench 502b). Dielectric layer 509 may cover the topmost conductive layer 507D, and may be patterned in a similar manner as dielectric layers 505A505D. In some embodiments, dielectric material 118 include an oxide such as silicon oxide, a nitride such as a silicon nitride, a combination thereof, a multilayer thereof, or the like. Optionally, an airgap 511 is formed in any unfilled space of the trenches.

As shown in FIG. 5B, after the formation of dielectric material 509, charge-storing structure 501 may be formed over substrate 506. Charge-storing structure 501 may include liner layer 504, dielectric layers 505A-505D, conductive layers 507A-507D, and dielectric material 509. In some embodiments, liner layer 504, dielectric layers 505A-505D, conductive layers 507A-507D, and dielectric material 509 extend continuously in the trenches (e.g., first trench 502a and second trench 502b). In some embodiments, the portion of charge-storing structure 501 in each trench is referred to as a charge-storing stack (e.g., 501-1 and 501-2). The charge-storing stacks may have the same patterns (or arrangement) as the patterns illustrated in the disclosure, e.g., patterns 200-203, 300, and/or 301. It should be noted that, although not shown in the figures, charge-storing structure 501 can extend in more than two trenches. For example, charge-storing structure 501 can extend in a plurality of groups of trenches in a die. In an example, charge-storing structure 501 can extend in all trenches in a same die. In another example, charge-storing structure 501 is formed in a single trench.

It should also be noted that, as an example, the DTC to be formed (or charge-storing structure 501) in method 600 includes four capacitor electrodes, e.g., formed by conductive layers 507A-507D. It should be noted that, although not shown, in other embodiments, the DTC may have more or less than four capacitor electrodes based on design requirements. As one of ordinary skill in the art will recognize, the above described process for forming DTCs is merely one method of forming the DTCs, and other methods are also fully intended to be included within the scope of the embodiments.

Referring back to FIG. 6, method 600 includes a block 606 where a plurality of contact vias are formed over the substrate. FIG. 5B illustrates a corresponding structure.

As shown in FIG. 5B, after forming charge-storing structure 501, an interconnect structure 503 is formed over substrate 506 and charge-storing structure 501. In some embodiments, interconnect structure 503 includes a plurality of dielectric layers with conductive features embedded in the plurality of dielectric layers. For example, interconnect structure 503 includes a dielectric layer 513, a dielectric layer 517, and a plurality of conductive vias 515 embedded in dielectric layers 513 and 517. In some embodiments, dielectric layers 513 and 517 may include a low-k dielectric material such as phosphosilicate glass (PSG), borophosphosilicate glass (BPSG), fluorosilicate glass (FSG), SiOxCy, Spin-On-Glass, Spin-On-Polymers, silicon carbon material, compounds thereof, composites thereof, combinations thereof, or the like. Dielectric layers 513 and 517 may be formed by any suitable method, such as spin-on coating, CVD, PECVD, ALD, a combination thereof, or the like. Conductive vias 515 may be formed using any suitable method, such as a damascene method, or the like. In some embodiments, a photomask having pattens 300 or 301 may be used to pattern dielectric layers 513 and 517. In some embodiments, the steps for forming conductive vias 515 include forming openings in the respective dielectric layers, depositing one or more barrier/adhesion layers (not shown) in the openings, depositing seed layers (not shown) over the one or more barrier/adhesion layers, and filling the openings with a conductive material. A chemical mechanical polishing (CMP) is then performed to remove excess materials of the one or more barrier/adhesion layers, the seed layers, and the conductive material overfilling the openings. In some embodiments, the one or more barrier/adhesion layers may comprise titanium, titanium nitride, tantalum, tantalum nitride, a combination thereof, or the like, and may be formed using PVD, CVD, ALD, a combination thereof, or the like. The seed layers may comprise copper, titanium, nickel, gold, manganese, a combination thereof, or the like, and may be formed by plating, ALD, CVD, PVD, sputtering, a combination thereof, or the like. The conductive material may comprise copper, aluminum, tungsten, combinations thereof, alloys thereof, or the like, and may be formed using, for example, by plating, or other suitable methods.

Conductive vias 515 may be formed between adjacent charge-storing stacks (e.g., 501-1 and 501-2), and may have the arrangement shown in patterns 300 and 301, or the like. Conductive vias 515 may each land on a corresponding part of charge-storing structure 501 to form electrical connections. In some embodiments, a first one (not shown) of the conductive vias 515 may be electrically coupled to substrate 506, one or more second ones of conductive vias 515 may be electrically coupled to two conductive layers (e.g., 507A and 507C), and one or more third ones of conductive vias 515 may be electrically coupled to the other two conductive layers (e.g., 507B and 507D). Conductive vias 515 may further be electrically coupled to other devices/structures, which are not shown in FIG. 5B for ease of illustration.

In an embodiment, the present disclosure provides an IC. The IC includes a charge-storing device, which includes a first charge-storing stack extending into a substrate, and a second charge-storing stack extending into the substrate and adjacent to the first charge-storing stack along a first direction. The first charge-storing stack and the second charge-storing stack extend lengthwise along a second direction perpendicular to the first direction. The first charge-storing stack and the second charge-storing stack have an offset along the second direction. The offset is greater than zero. In some embodiments, the first charge-storing stack has a length in the second direction, a spacing between the first charge-storing stack and the second charge-storing stack is no more than about 10% of the length along the first direction, and the offset is between about ⅓ of the length and the length. In some embodiments, the offset is between about ⅓ of the length and about ⅔ of the length. In some embodiments, the charge-storing device further includes another first charge-storing stack adjacent to the first charge-storing stack along the second direction, the other first charge-storing stack having a spacing from the first charge-storing stack in the second direction, and the spacing is less than or equal to ⅓ of the length. In some embodiments, the charge-storing device further includes another first charge-storing stack adjacent to the first charge-storing stack along the second direction. The other first charge-storing stack has a spacing from the first charge-storing stack in the second direction, and the offset is equal to about ½ (length+ spacing). In some embodiments, the offset is greater than ⅓ of the length.

In some embodiments, the charge-storing device further includes, a third charge-storing stack extending into the substrate, and a fourth charge-storing stack extending into the substrate adjacent to the third charge-storing stack along the first direction. The third charge-storing stack and the fourth charge-storing stack extend lengthwise along the second direction, the third charge-storing stack is aligned with the first charge-storing stack along the first direction, and the fourth charge-storing stack is aligned with the second charge-storing stack along the first direction. In some embodiments, the charge-storing device further includes, a third charge-storing stack extending into the substrate, and a fourth charge-storing stack extending into the substrate adjacent to the third charge-storing stack along the second direction. The third charge-storing stack and the fourth charge-storing stack each extends lengthwise along the second direction, the third charge-storing stack is aligned with the first charge-storing stack along the second direction, and the fourth charge-storing stack is aligned with the second charge-storing stack along the second direction.

In some embodiments, the charge-storing device further includes, a third charge-storing stack extending into the substrate, and a fourth charge-storing stack extending into the substrate adjacent to the third charge-storing stack along the second direction. The third charge-storing stack and the fourth charge-storing stack extend lengthwise along the first direction, and the first charge-storing stack and the second charge-storing stack have the offset in the first direction. In some embodiments, the charge-storing device further includes a fifth charge-storing stack extending into the substrate and adjacent to the second charge-storing stack along the first direction. The fifth charge-storing stack extends lengthwise in the second direction, a distance between the fifth charge-storing stack and the second charge-storing stack is no more than about 10% of the length along the first direction, and the fifth charge-storing stack and the first charge-storing stack have a second offset in the second direction. In some embodiments, the second offset is between about the offset and about ⅔ of the length. In some embodiments, the second offset is about two times the offset. In some embodiments, the first charge-storing stack and the second charge-storing stack includes a dielectric layer over the substrate and a plurality of conductive layers over the dielectric layer.

In another embodiment, the present disclosure provides an IC. The IC includes a charge-storing device, which includes a first charge-storing stack extending into a substrate, a second charge-storing stack extending into the substrate and adjacent to the first charge-storing stack, and a contact via between the first charge-storing stack and the second charge-storing stack. The first charge-storing stack and the second charge-storing stack extend lengthwise in a first direction. In some embodiments, along the first direction, the first charge-storing stack is at least partially overlapped with the second charge-storing stack, and the contact via is between the first charge-storing stack and the second charge-storing stack along a second direction perpendicular to the first direction. In some embodiments, the charge-storing device further includes a third charge-storing stack extending into the substrate. The third charge-storing stack extends along the first direction and is between the first charge-storing stack and the second charge-storing stack, and the third charge-storing stack is partially overlapped with each of the first charge-storing stack and the second charge-storing stack. In some embodiments, an overlapped length between the third charge-storing stack and the first charge-storing stack, and an overlapped length between the third charge-storing stack and the second charge-storing stack are each between about ⅓ of a length of the first charge-storing stack and about ⅔ of the length of the first charge-storing stack.

In yet another embodiment, the present disclosure provides a method for forming a semiconductor device, which includes forming a first trench and a second trench in a substrate. The first trench and the second trench each extends along a first direction, and the first trench and the second trench have an offset along the first direction, the offset being greater than zero. In some embodiments, the forming of the first trench and the second trench includes patterning the substrate to form the first trench and the second trench. The first trench and the second trench each has a length-to-width ratio of at least 10 and a depth-to-width ratio of at least 10, along a second direction perpendicular to the first direction, the first trench and the second trench are separated by a distance of no more than about 10% of a length of the first trench, and the offset is between about ⅓ of the length of the first trench and about ⅔ of the length of the first trench. In some embodiments, the method further includes forming a charge-storing structure in each of the first trench and the second trench. The forming of the charge-storing structure includes forming a first dielectric layer over each of the first trench and the second trench, forming a first conductive layer over the first dielectric layer, forming a second dielectric layer over the first conductive layer, and forming a second conductive layer over the second dielectric layer.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An integrated circuit (IC), comprising:
 a charge-storing device comprising:
  a first charge-storing stack extending into a substrate; and
  a second charge-storing stack extending into the substrate and adjacent to the first charge-storing stack along a first direction,
  wherein:
   the first charge-storing stack and the second charge-storing stack comprise:
    a liner layer over the substrate; and
    a plurality of dielectric layers and a plurality of conductive layers over the liner layer in an alternating manner;
   the first charge-storing stack and the second charge-storing stack extend lengthwise along a second direction perpendicular to the first direction;
   the first charge-storing stack has a length along the second direction;
   a spacing between the first charge-storing stack and the second charge-storing stack is no more than about 10% of the length along the first direction;
   the first charge-storing stack and the second charge-storing stack have an offset along the second direction; and
   the offset is between about ⅓ of the length and about ⅔ of the length.

2. The IC of claim 1, wherein
 the charge-storing device is a deep trench capacitor.

3. The IC of claim 2, wherein the liner layer comprises silicon oxide, silicon oxynitride, silicon carboxynitride, or a combination thereof.

4. The IC of claim 2, wherein:
 the charge-storing device further comprises another first charge-storing stack adjacent to the first charge-storing stack along the second direction, the another first charge-storing stack having a spacing from the first charge-storing stack in the second direction; and
 the spacing is less than or equal to ⅓ of the length.

5. The IC of claim 1, wherein the plurality of conductive layers comprise doped silicon, polysilicon, copper, tungsten, an aluminum alloy, a copper alloy, titanium, titanium nitride, tantalum, tantalum nitride, or a combination thereof.

6. The IC of claim 1, wherein:
 the charge-storing device further comprises another first charge-storing stack adjacent to the first charge-storing stack along the second direction, the another first charge-storing stack having a spacing from the first charge-storing stack in the second direction; and
the offset is equal to about ½ (length+spacing).

7. The IC of claim 1, wherein the charge-storing device further comprises:
a third charge-storing stack extending into the substrate; and
a fourth charge-storing stack extending into the substrate adjacent to the third charge-storing stack along the first direction,
wherein:
the third charge-storing stack and the fourth charge-storing stack extend lengthwise along the second direction;
the third charge-storing stack is aligned with the first charge-storing stack along the first direction; and
the fourth charge-storing stack is aligned with the second charge-storing stack along the first direction.

8. The IC of claim 1, wherein the charge-storing device further comprises:
a third charge-storing stack extending into the substrate; and
a fourth charge-storing stack extending into the substrate adjacent to the third charge-storing stack along the second direction,
wherein:
the third charge-storing stack and the fourth charge-storing stack each extends lengthwise along the second direction;
the third charge-storing stack is aligned with the first charge-storing stack along the second direction; and
the fourth charge-storing stack is aligned with the second charge-storing stack along the second direction.

9. The IC of claim 1, wherein the charge-storing device further comprises:
a third charge-storing stack extending into the substrate; and
a fourth charge-storing stack extending into the substrate adjacent to the third charge-storing stack along the second direction,
wherein:
the third charge-storing stack and the fourth charge-storing stack extend lengthwise along the first direction; and
the third charge-storing stack and the fourth charge-storing stack have the offset in the first direction.

10. The IC of claim 1, wherein the charge-storing device further comprises:
a fifth charge-storing stack extending into the substrate and adjacent to the second charge-storing stack along the first direction,
wherein:
the fifth charge-storing stack extends lengthwise in the second direction;
a distance between the fifth charge-storing stack and the second charge-storing stack is no more than about 10% of the length along the first direction; and
the fifth charge-storing stack and the first charge-storing stack have a second offset in the second direction.

11. The IC of claim 10, wherein the second offset is between about the offset and about ⅔ of the length.

12. The IC of claim 11, wherein the second offset is about two times the offset.

13. The IC of claim 1, wherein the
plurality of dielectric layers comprise zirconium oxide, aluminum oxide, or a combination thereof.

14. An integrated circuit (IC), comprising:
a charge-storing device comprising:
a first charge-storing stack extending into a substrate;
a second charge-storing stack extending into the substrate and adjacent to the first charge-storing stack;
a third charge-storing stack extending into the substrate and partially overlapped with the first charge-storing stack and the second charge-storing stack; and
a contact via between the first charge-storing stack and the second charge-storing stack along a first direction,
wherein the first charge-storing stack and the second charge-storing stack extend lengthwise in a second direction perpendicular to the first direction; and
wherein an overlapped length between the third charge-storing stack and the first charge-storing stack, and an overlapped length between the third charge-storing stack and the second charge-storing stack are each between about ⅓ of a length of the first charge-storing stack and about ⅔ of the length of the first charge-storing stack.

15. The IC of claim 14, wherein the first charge-storing stack and the second charge-storing stack are aligned with each other along the first direction.

16. The IC of claim 14, wherein the
the third charge-storing stack extends along the second direction and is between the first charge-storing stack and the second charge-storing stack.

17. The IC of claim 16, wherein
each of the first charge-storing stack, the second charge-storing stack and the third charge-storing stack comprises:
a liner layer over the substrate; and
a plurality of dielectric layers and a plurality of conductive layers over the liner layer in an alternating manner.

18. A semiconductor device, comprising:
a substrate;
a first charge-storing stack extending into the substrate; and
a second charge-storing stack extending into the substrate and adjacent to the first charge-storing stack along a first direction,
wherein the first charge-storing stack and the second charge-storing stack comprise:
a liner layer over the substrate, and
a plurality of dielectric layers and a plurality of conductive layers over the liner layer in an alternating manner,
wherein the first charge-storing stack and the second charge-storing stack extend lengthwise along a second direction perpendicular to the first direction,
wherein the first charge-storing stack has a length along the second direction,
wherein a spacing between the first charge-storing stack and the second charge-storing stack is no more than about 10% of the length along the first direction
wherein the first charge-storing stack and the second charge-storing stack have an offset along the second direction, and
wherein the offset is between about ⅓ of the length and about ⅔ of the length.

19. The semiconductor device of claim 18, wherein the first charge-storing stack and the second charge-storing stack are part of a deep trench capacitor.

20. The semiconductor device of claim 18,
wherein the liner layer comprises silicon oxide, silicon oxynitride, silicon carboxynitride, or a combination thereof,
wherein the plurality of dielectric layers comprise zirconium oxide, aluminum oxide, or a combination thereof.

* * * * *